US012637811B2

(12) United States Patent
Li et al.

(10) Patent No.: US 12,637,811 B2
(45) Date of Patent: May 26, 2026

(54) RAIL SYSTEM FOR WAFER TRANSPORTATION

(71) Applicant: Taiwan Semiconductor Manufacturing Company, Ltd., Hsinchu (TW)

(72) Inventors: Guancyun Li, Miaoli County (TW); Ching-Jung Chang, Taichung City (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 991 days.

(21) Appl. No.: 17/849,038

(22) Filed: Jun. 24, 2022

(65) Prior Publication Data

US 2023/0416994 A1     Dec. 28, 2023

(51) Int. Cl.
E01B 25/24        (2006.01)
B65G 17/20        (2006.01)
H10P 72/30        (2026.01)

(52) U.S. Cl.
CPC .............. E01B 25/24 (2013.01); B65G 17/20 (2013.01); H10P 72/3221 (2026.01); B65G 2201/0297 (2013.01)

(58) Field of Classification Search
CPC ......... H01L 21/67733; H01L 21/37706; H01L 21/37703; H01L 21/67727; H01L 21/6773; E01B 25/24; E01B 25/00; E01B 13/02; E01B 25/22; B65G 1/0457; B65G 2201/0297; B65G 21/22; B65G 21/20; B65G 17/20; B65G 17/30; B61B 3/00;
(Continued)

(56) References Cited

FOREIGN PATENT DOCUMENTS

| CN | 101498115 A | 8/2009 |
| CN | 111099288 A | 5/2020 |
| CN | 111996846 A | 11/2020 |

(Continued)

OTHER PUBLICATIONS

Chieh Hsu et al., Wafer Transportation, U.S. Appl. No. 17/832,605, filed Jun. 4, 2022, Assignee: Taiwan Semiconductor Manufacturing Company, Ltd., 27 pages specification, 12 pages drawings.

*Primary Examiner* — S. Joseph Morano
*Assistant Examiner* — Heaven R Buffington
(74) *Attorney, Agent, or Firm* — HAYNES AND BOONE, LLP

(57)        ABSTRACT

The present disclosure provides a method to install a rail assembly according to different rail plans. A method according to the present disclosure includes assembling an overhead raceway module that includes a plurality of first level raceways extending along a first direction, and a plurality of second level raceways extending along a second direction perpendicular to the first direction, each of the plurality of second level raceways being fastened to the plurality of first level raceways, raising the overhead raceway module adjacent to a ceiling, installing the overhead raceway module to the ceiling, and fastening a rail assembly to the plurality of second level raceways, the rail assembly extending lengthwise along the first direction. A width of the overhead raceway module along the second direction is at least three times a width of the rail assembly along the second direction.

20 Claims, 20 Drawing Sheets

(58) Field of Classification Search
CPC .... B66C 7/00; B66C 7/02; B66C 7/04; B66C
7/06
USPC .............. 104/89, 90, 91, 92, 93, 94, 95, 111
See application file for complete search history.

(56) References Cited

FOREIGN PATENT DOCUMENTS

| | | | | | |
|---|---|---|---|---|---|
| CN | 113348140 | A | | 9/2021 | |
| KR | 20200048432 | A | * | 5/2020 | ....... H01L 21/67733 |
| TW | 201716312 | A | | 5/2017 | |
| TW | 201922547 | A | | 6/2019 | |

* cited by examiner

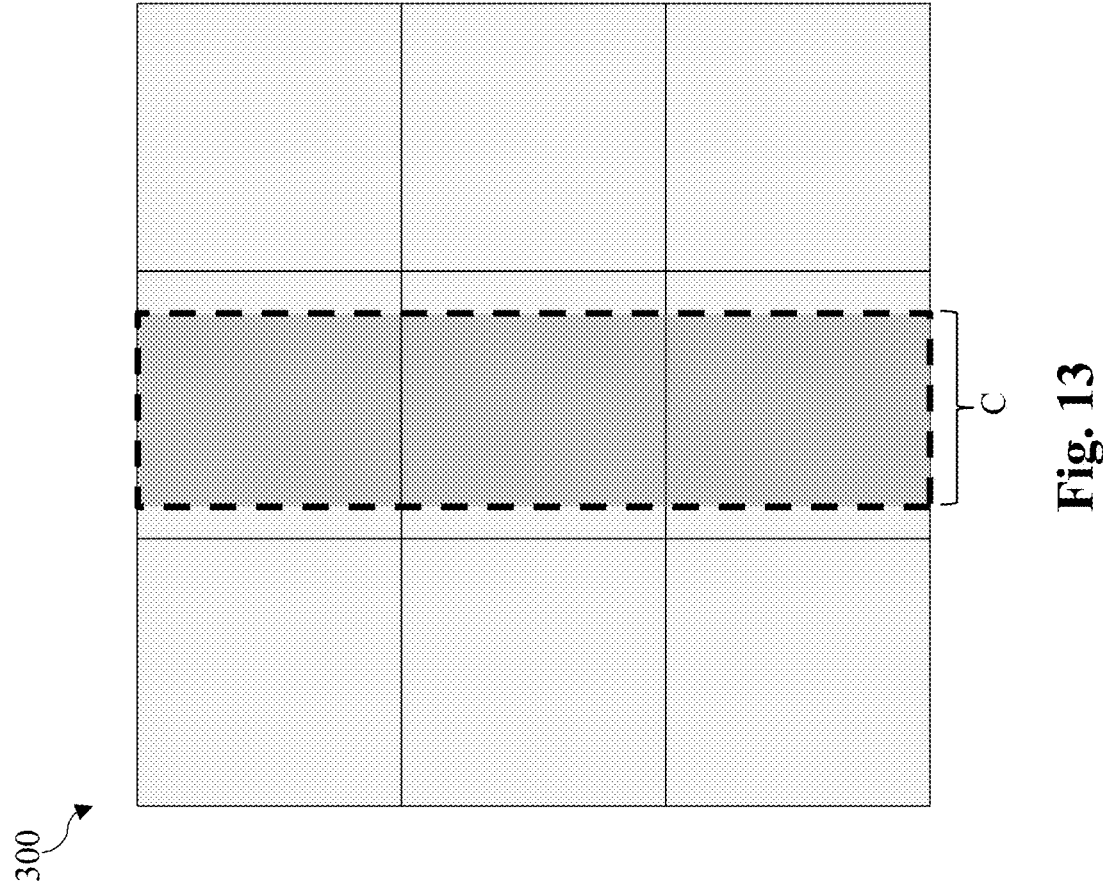
300
C
Fig. 13
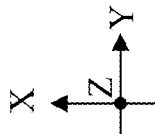

RAIL SYSTEM FOR WAFER TRANSPORTATION

BACKGROUND

The manufacture of semiconductor devices involves the performance of a series of process steps using a variety of high-tech production and metrology tools in a certain order and often within a certain period of time. The primary function of a wafer logistics system in a wafer fabrication facility, or "fab," is to deliver the wafers to each of the tools at the right time, as well as to track the location and status of the wafers throughout the process. Automated material handling systems ("AMHS") are applied to wafer fabs to carry out the automated functions more efficiently, consistently, and safely than can be done via manual means.

An AMHS includes an overhead transport ("OHT") system that includes rails that are mounted to the ceiling of a fab floor. OHT vehicles can travel along the rails to transport wafers among different loading ports of different tools. In some existing technologies, the rails and structures supporting the same are installed component-by-component to different locations on the ceiling according a rail plan. When changes are made to the fab to accommodate different fabrication processes, the existing rail plan may no longer work and the rails have to be uninstalled from current positions and reinstalled to new locations according to a new rail plan. This existing practice may lead to prolonged installation lead time and fab ramping time, which may lead to increased production cost. Therefore, although existing OHT systems and method of installation have been generally adequate for their intended purposes, they have not been entirely satisfactory in all respects.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 2-17 illustrates schematic drawings illustrating different operations of the method 100 in FIG. 1, according to various aspects of the present disclosure.

DETAILED DESCRIPTION

Figure 1:
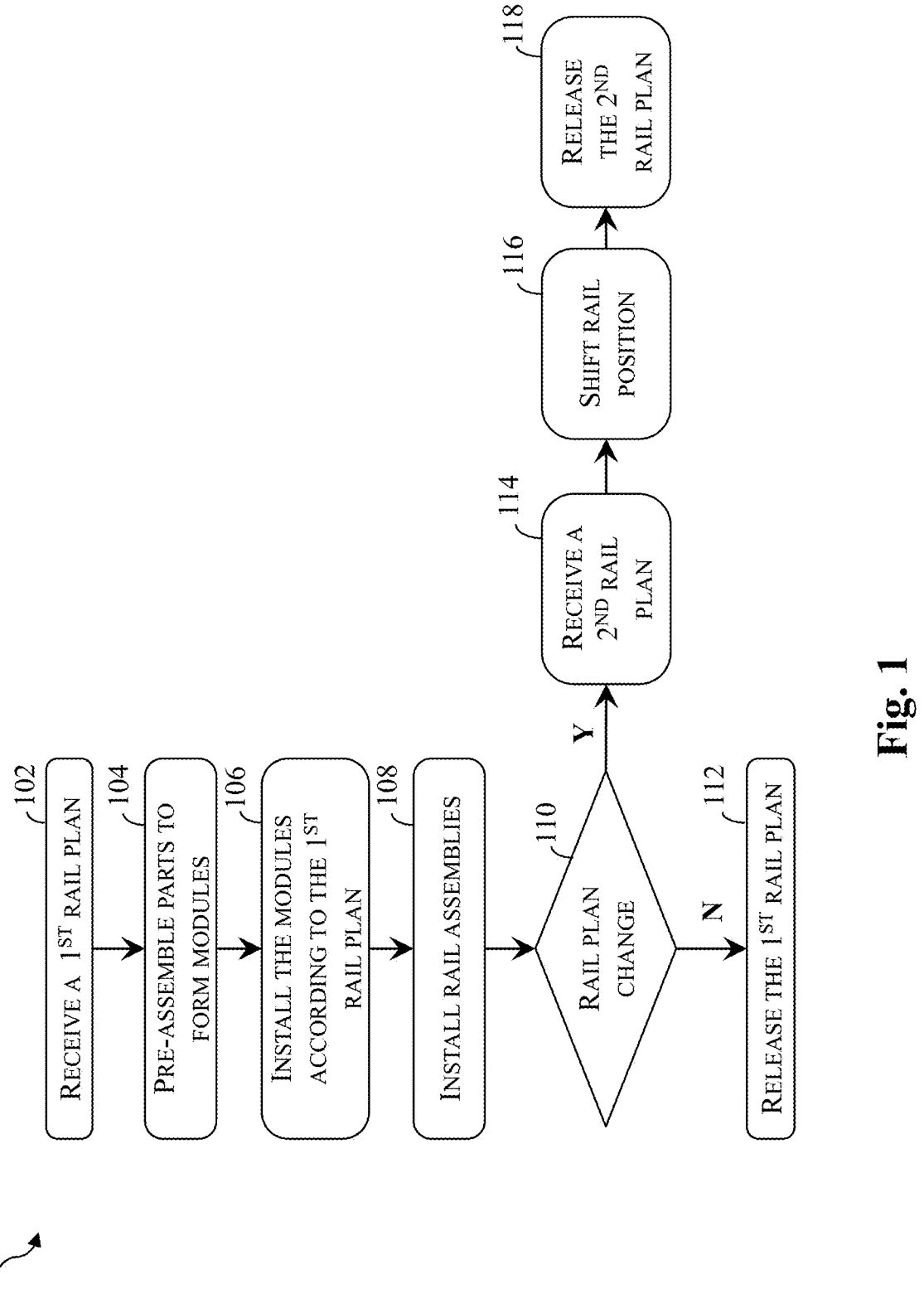
FIG. 1 illustrates a flowchart of a method 100 for implementing different rail plans, according to various aspects of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Further, when a number or a range of numbers is described with "about," "approximate," and the like, the term is intended to encompass numbers that are within a reasonable range considering variations that inherently arise during manufacturing as understood by one of ordinary skill in the art. For example, the number or range of numbers encompasses a reasonable range including the number described, such as within +/−10% of the number described, based on known manufacturing tolerances associated with manufacturing a feature having a characteristic associated with the number. For example, a material layer having a thickness of "about 5 nm" can encompass a dimension range from 4.25 nm to 5.75 nm where manufacturing tolerances associated with depositing the material layer are known to be +/−15% by one of ordinary skill in the art. Still further, the present disclosure may repeat reference numerals and/or letters in the various examples. This repetition is for the purpose of simplicity and clarity and does not in itself dictate a relationship between the various embodiments and/or configurations discussed.

A semiconductor foundry may include a number of fabs. During fabrication, a wafer may be transferred within a single fab across vast distance. The transport of wafers in a fab is usually carried out by an AMHS. In general, an AMHS is any computer controlled system in a fab that moves wafers (or workpieces) between work stations (or process tools) or between work stations and storage locations. When being transported, wafers (or workpieces) are placed in a wafer carrier (e.g., a front opening unified pod "FOUP") and the wafer carrier is carried by a vehicle that is guided by the AMHS. In some examples, the vehicle is part of an OHT system that includes a network of guide rails. The vehicles travel and stop along the guide rails to pick up and deliver the wafers (or workpieces. Due to the weight of the FOUPs, the wafers, and the vehicles, the guide rails are made with sturdy materials and are secured to the fab ceiling. In some existing technology, a rail plan is designed based on the fab layout design such that the vehicle can travel over and dock directly above loading ports of the processing tools. Once the rail plan is determined, guide rails and their supporting structures, such as hangers and raceways, are installed component-by-component to ceiling locations to execute the rail plan. When a new fab plan is needed to accommodate a process change or fabrication of a new product, a new rail plan will be needed. To implement the new rail plan, the guide rails and supporting structures will need to be removed from their current ceiling locations and reinstalled to new ceiling locations. The uninstallation and reinstallation of the guide rails and their supporting structures can lead to increased installation lead time and fabrication ramping time, resulting in increased cost and reduced flexibility.

The present disclosure provides methods and structures to install overhead raceway modules that improve the flexibility when a new rail plan is needed to service a new fab floor plan. The present disclosure includes several aspects. In one aspect, the supporting structures for the guide rails, such as raceways and hangers, are pre-assembled into modules before they are installed to the fab ceiling. In another aspect, each of the raceway modules is wider than a guide rail it supports so as to include more than one installation positions along a direction perpendicular to the rail length direction. The multiple installation positions allow the guide rail to shift positions to accommodate different load port positions without needing to uninstall the support structures. In still another aspect, the raceway module may include a slide rail such that the guide rail can slide among different installation positions on the raceway module. The methods and structures in the present disclosure shorten installation lead time, cut ramping time, reduce cost, and increase floor plan flexibility.

Figure 17:
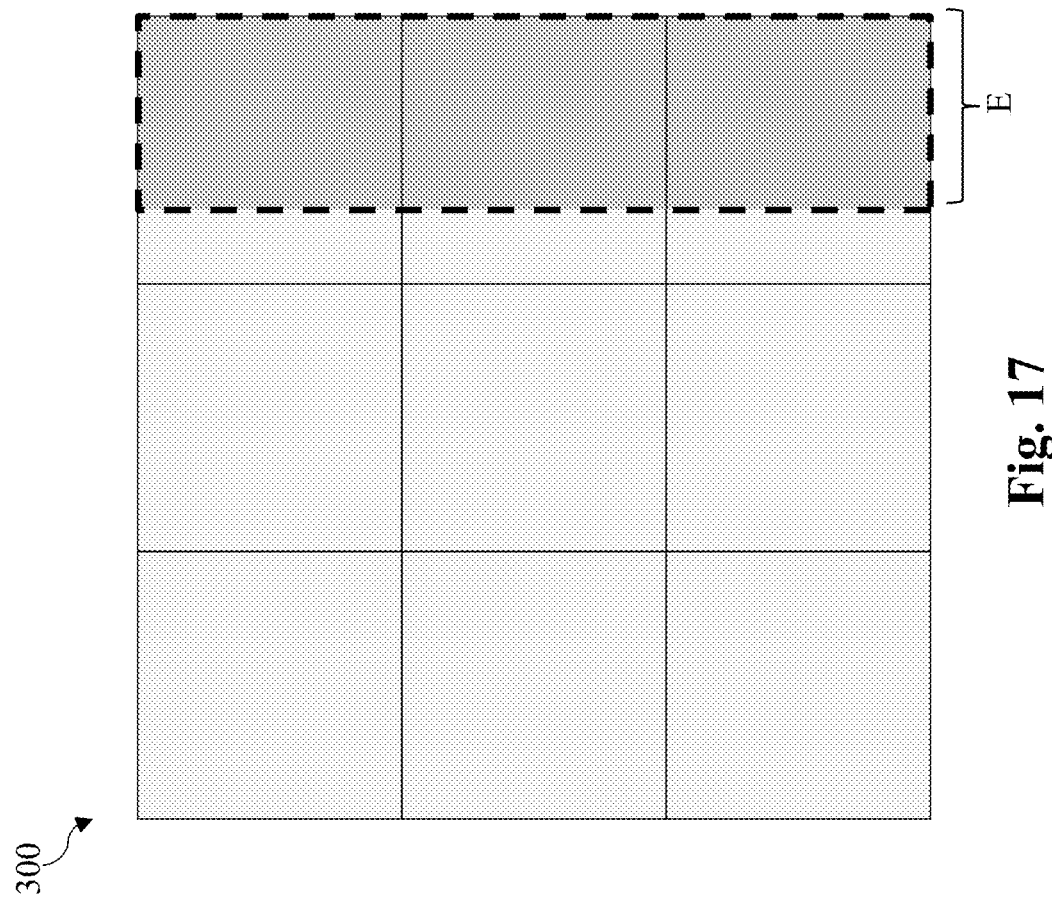
Figure 17:
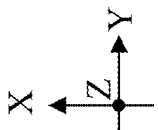
Figure 18:
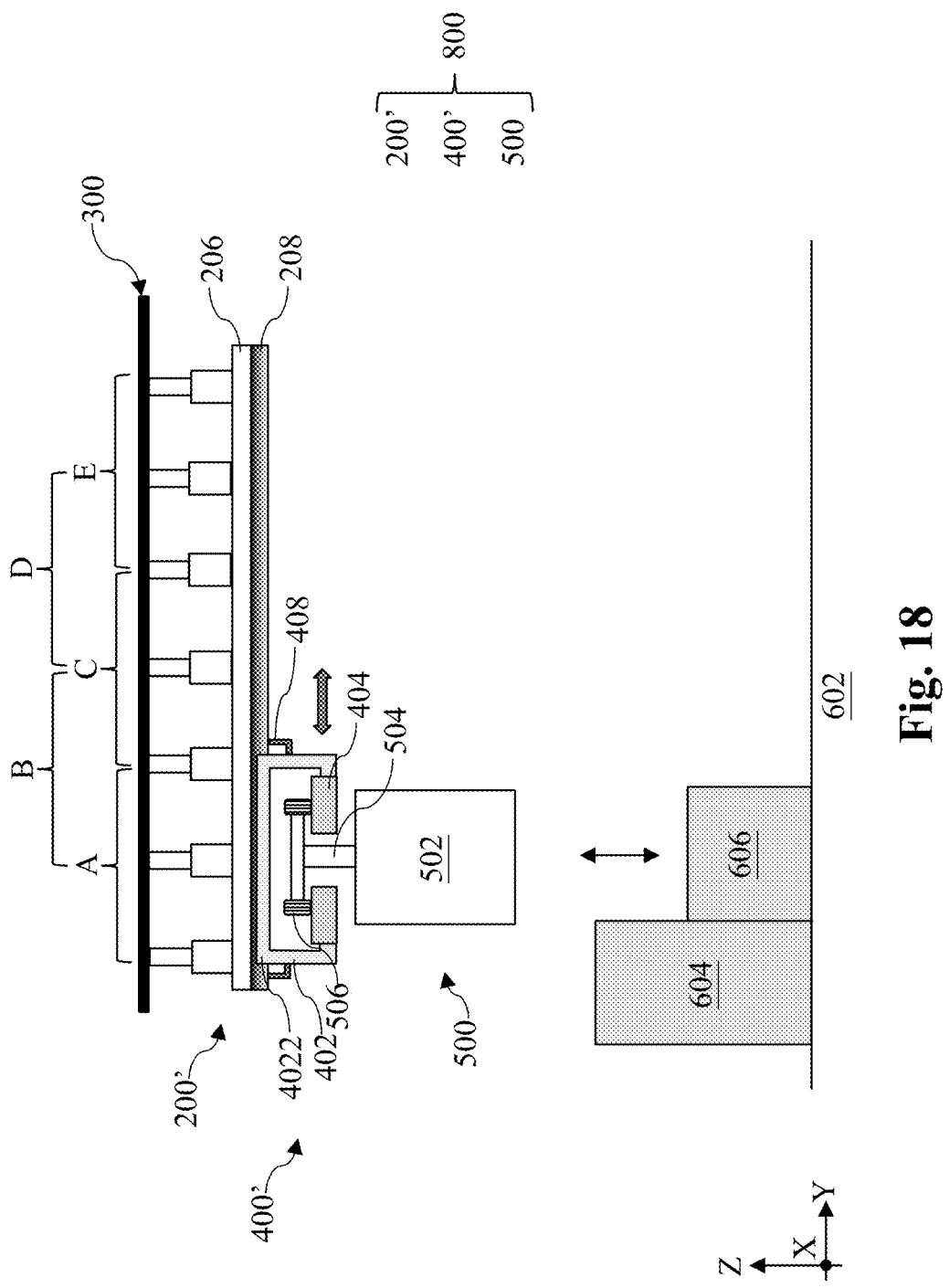
FIGS. 18 and 19 illustrate different embodiments of a slidable rail system, according to various aspects of the present disclosure.
Figure 19:
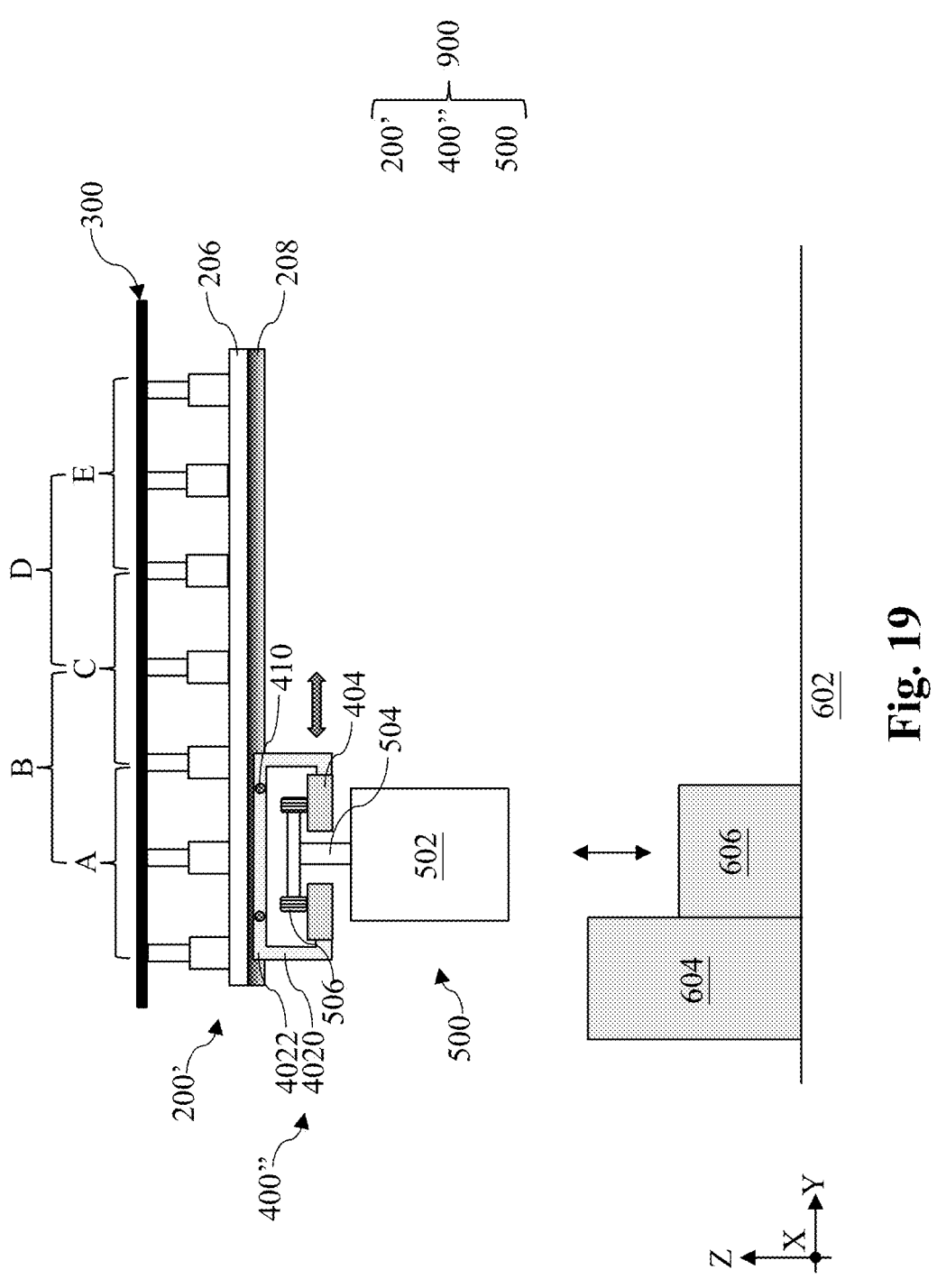
Figures 20, 21:
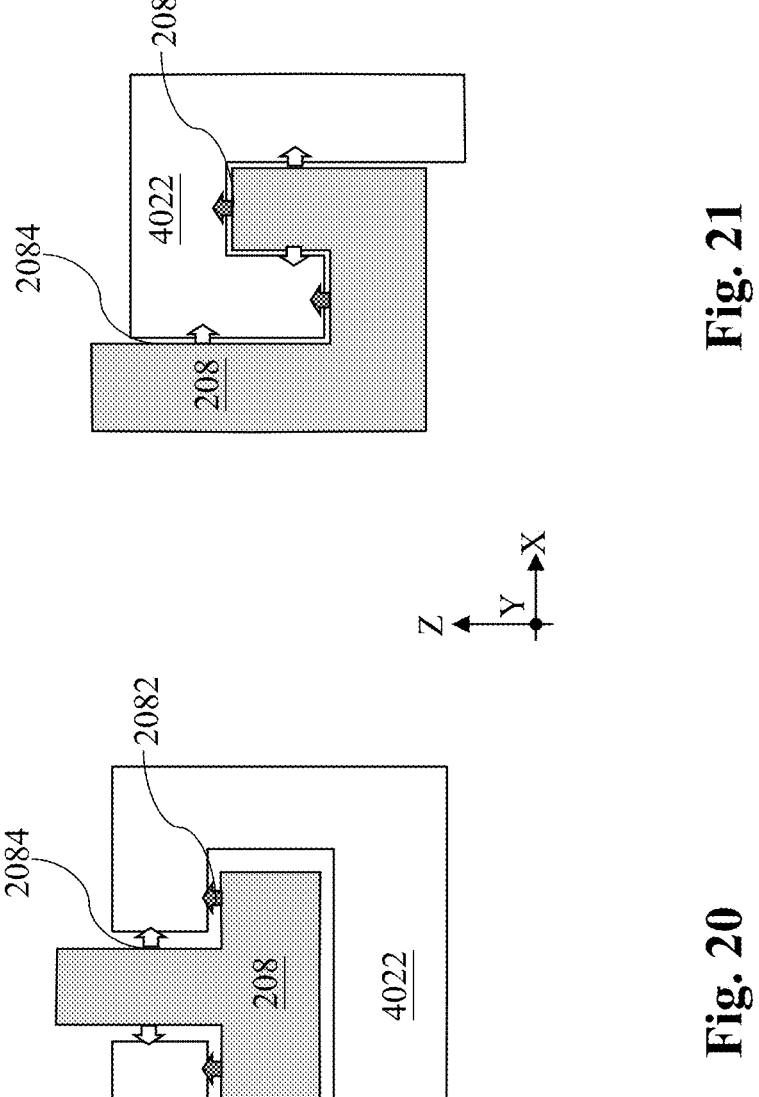
FIGS. 20 and 21 illustrate example embodiments of slide rails that may be implemented in the slidable rail system shown in FIGS. 18 and 19, according to various aspects of the present disclosure.

The various aspects of the present disclosure will now be described in more detail with reference to the figures. In that regard, FIG. 1 is a flowchart illustrating method 100 of implementing different rail plans according to embodiments of the present disclosure. Method 100 is merely an example and is not intended to limit the present disclosure to what is explicitly illustrated in method 100. Additional steps may be provided before, during and after the method 100, and some steps described can be replaced, eliminated, or moved around for additional embodiments of the method. Not all steps are described herein in detail for reasons of simplicity. Method 100 is described below in conjunction with FIGS. 2-17, which are schematic or representative illustrations of operations of method 100. Throughout the present application, like reference numerals denote like features, unless otherwise excepted. The X, Y and Z directions are used consistently in FIGS. 2-17 and are perpendicular to one another. FIGS. 18 and 19 include alternative embodiments where slide rails are implemented to allow sliding movement of guide rails among different installation positions. FIGS. 20 and 21 illustrate example slide rail designs to implement the alternative embodiments shown in FIGS. 18 and 19.

Figure 2:
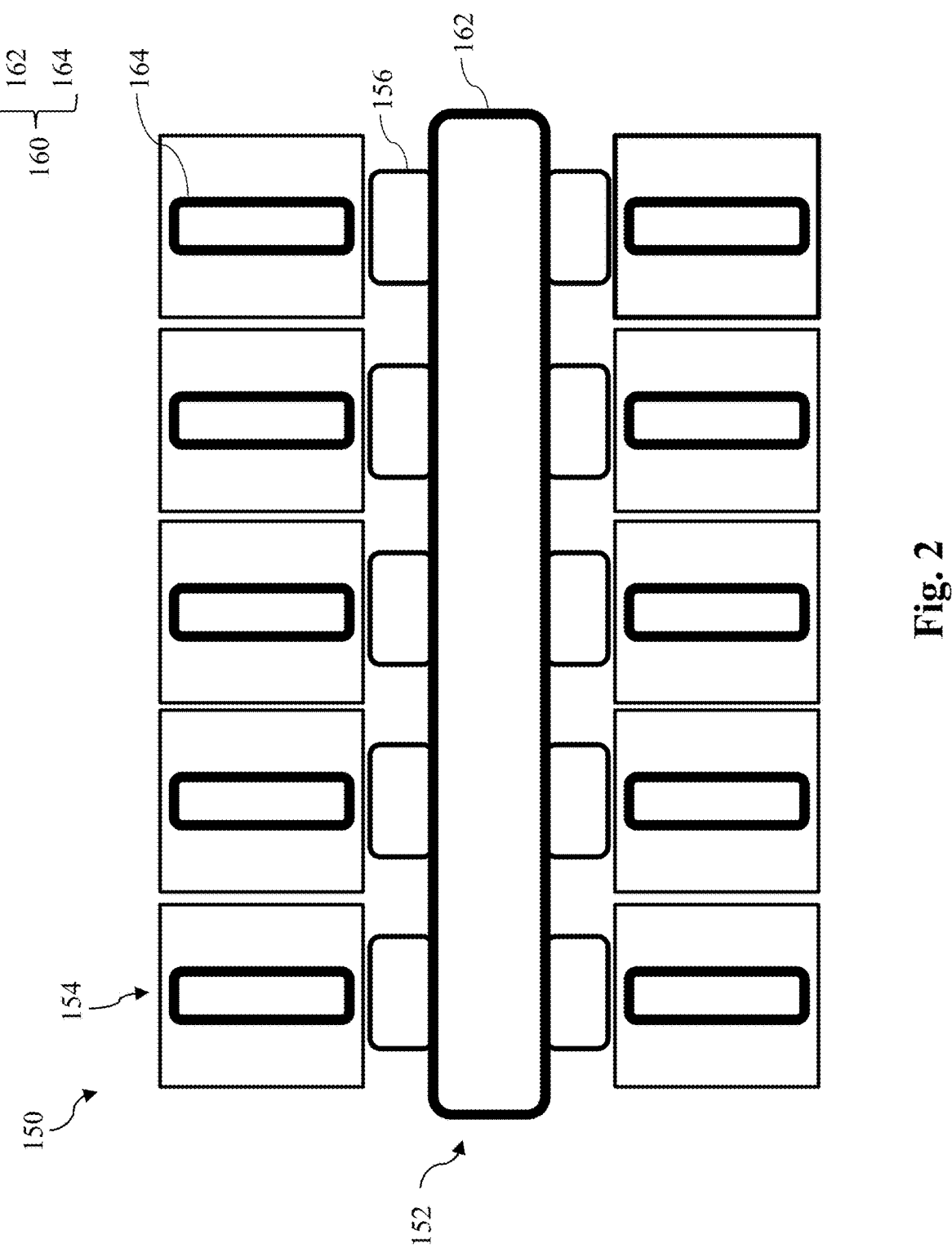

Referring to FIGS. 1 and 2, method 100 includes a block 102 where a first rail plan 160 is received. In some embodiments represented in FIG. 2, the first rail plan 160 is a part of a fab layout design 150. The fab layout design 150 includes a center aisle 152 and a plurality of process bays 154. Each of the process bays may include one or more process tools. In some implementations, each of the process bays 154 includes a wafer stocker 156 adjacent the center aisle 152. Each of the wafer stockers 156 is configured to hold multiple standard mechanical interface (SMIF) pods or front opening unified pods (FOUPs). Each of the SMIF pods and the FOUPs can carry multiple wafers. The center aisle 152 includes an interbay overhead transport (OHT) guide rail 162 that is capable to move wafers among different process bays 154. Each of the process bays 154 includes an intrabay OHT guide rail 164. Each of the intrabay OHT guide rails 164 provides wafer transport within the process bay 154. The plans or layouts of the interbay OHT guide rail 162 and the intrabay OHT guide rail 164 may be collectively referred to as the first rail plan 160 or the first guide rail plan 160. It can be seen that the first rail plan 160 depends on numbers and locations of the process bays 154 or dimensions of the process tools.

Figure 3:
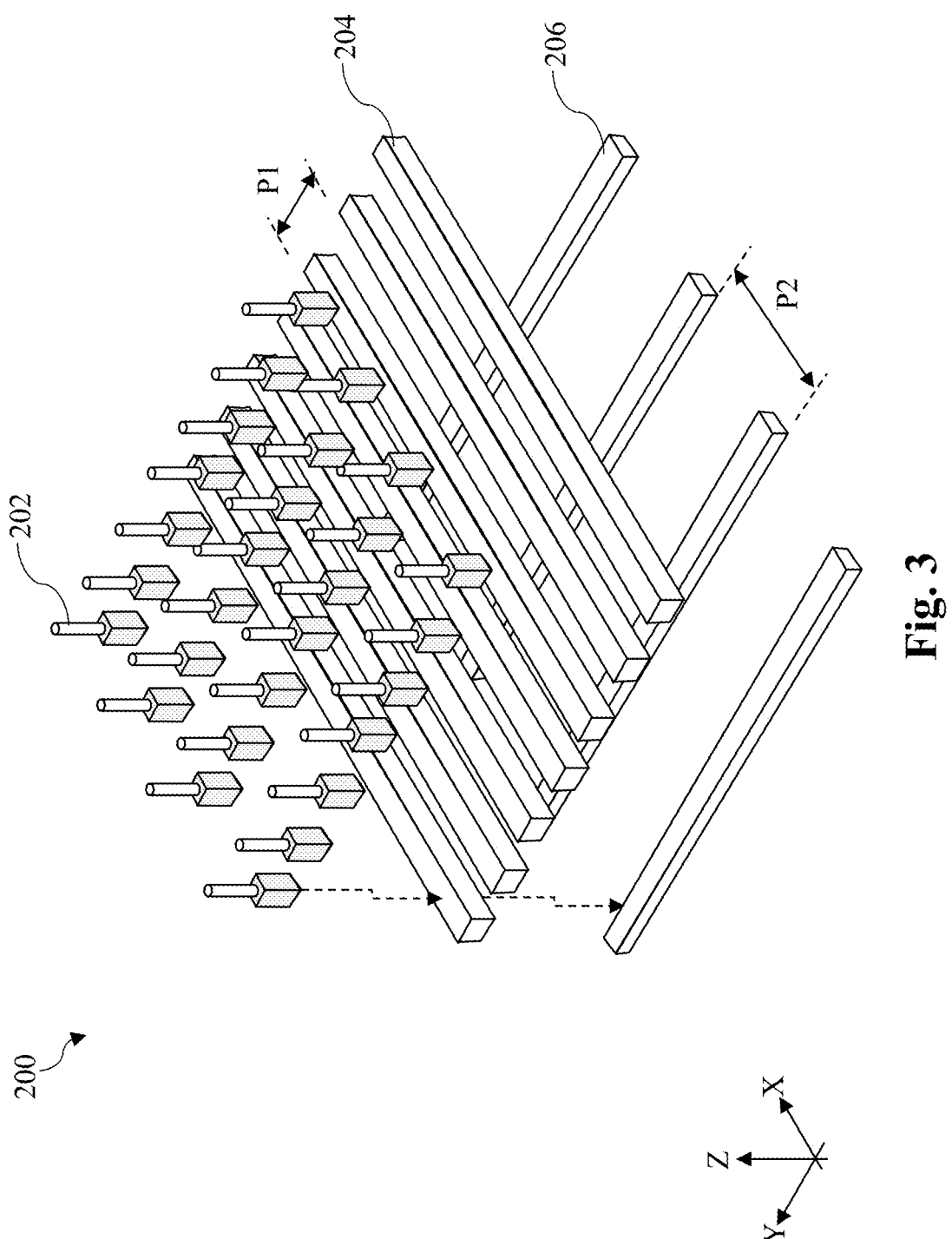
Figure 4:
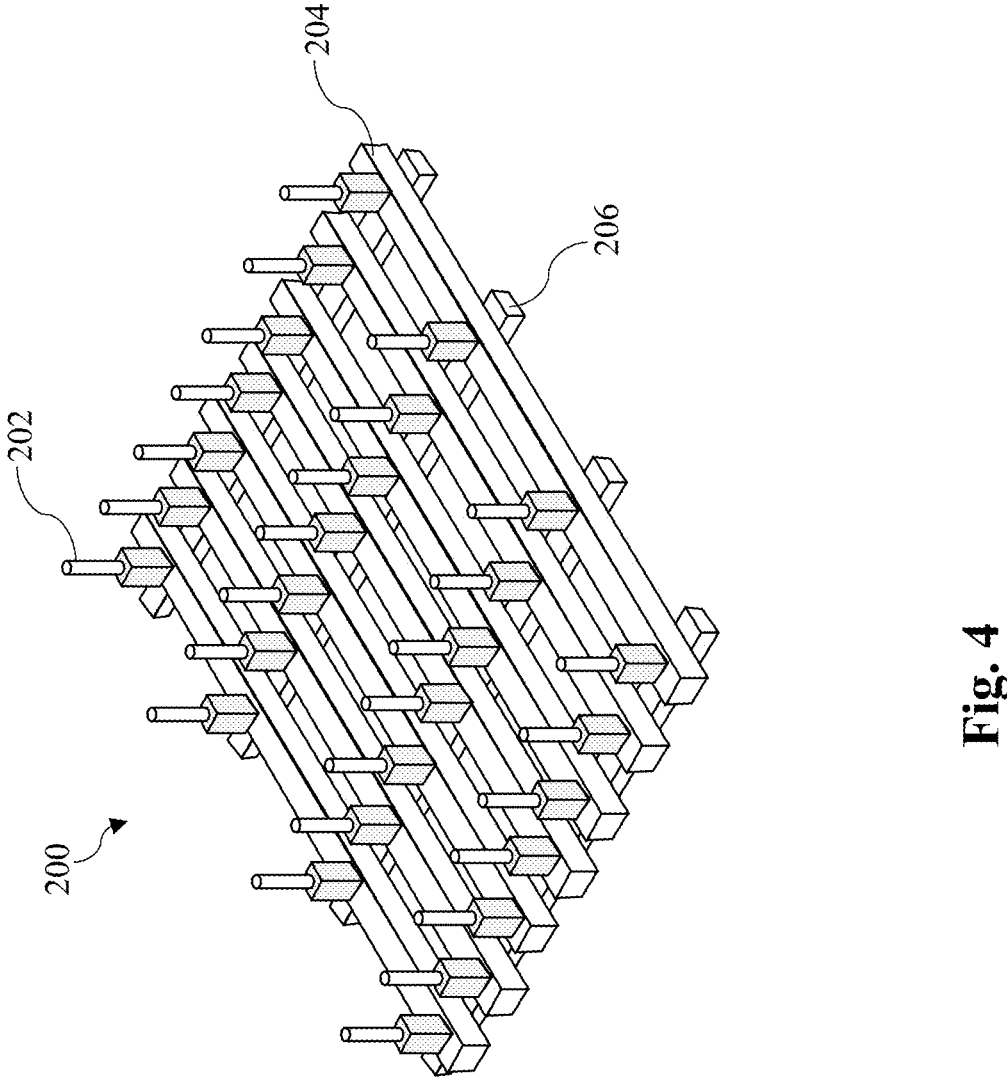
Figure 4:
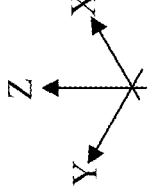

Referring to FIGS. 1, 3 and 4, method 100 includes a block 104 where raceway modules 200 are pre-assembled. The intrabay OHT guide rail 164 and the interbay OHT guide rail 162 may be supported by the raceway module 200 that includes several components, such as hangers 202, first level raceways 204 and second level raceways 206. The hangers 202 are configured to be installed or mounted to a ceiling of a fab. Each of the first level raceways 204 extends lengthwise along the X direction. Each of the second level raceways 206 extends lengthwise along the Y direction. The X direction is perpendicular to the Y direction. As described above, these components may be installed component-by-component on the fab ceiling based on the first rail plan 160. For example, the hangers 202 are first fastened to designated locations on the fab ceiling. Then the first level raceways 204 are fastened to the hangers 202. Afterwards, the second level raceways 206 are fastened to the first level raceways 204. In the present disclosure, the hangers 202, the first level raceways 204 and the second level raceways are pre-assembled into raceway modules 200 on fab floors before their installation. The assembled raceway modules 200 are then elevated to a level adjacent the fab ceiling for installation. In other words, according to the present disclosure, the raceway modules 200 are pre-assembled and are installed module-by-module.

Each of the raceway modules 200 is obviously larger than any of the components therein. That said, the raceway module 200 cannot be too large as it will be too heavy to be elevated to the ceiling level safely or too large to be maneuvered around the fab. In some embodiments, the raceway module 200 may have an X-direction length between about 150 cm and about 210 cm, such as around 180 cm. The raceway module 200 may have a Y-direction width between about 150 cm and about 210 cm, such as around 180 cm. In the depicted embodiment, the first level raceways 204 are disposed at a first pitch P1 around 30 cm and the second level raceways 206 are disposed at a second pitch P2 around 30 cm, as illustrated in FIG. 3. To provide adequate mechanical support, each of the hangers 202 is fastened to intersection points where one first level raceway 204 intersects one underlying second level raceway 206, as shown by the dotted arrows in FIG. 3. FIG. 4 illustrates a raceway module 200 that includes all the components shown in FIG. 3.

Figure 5:
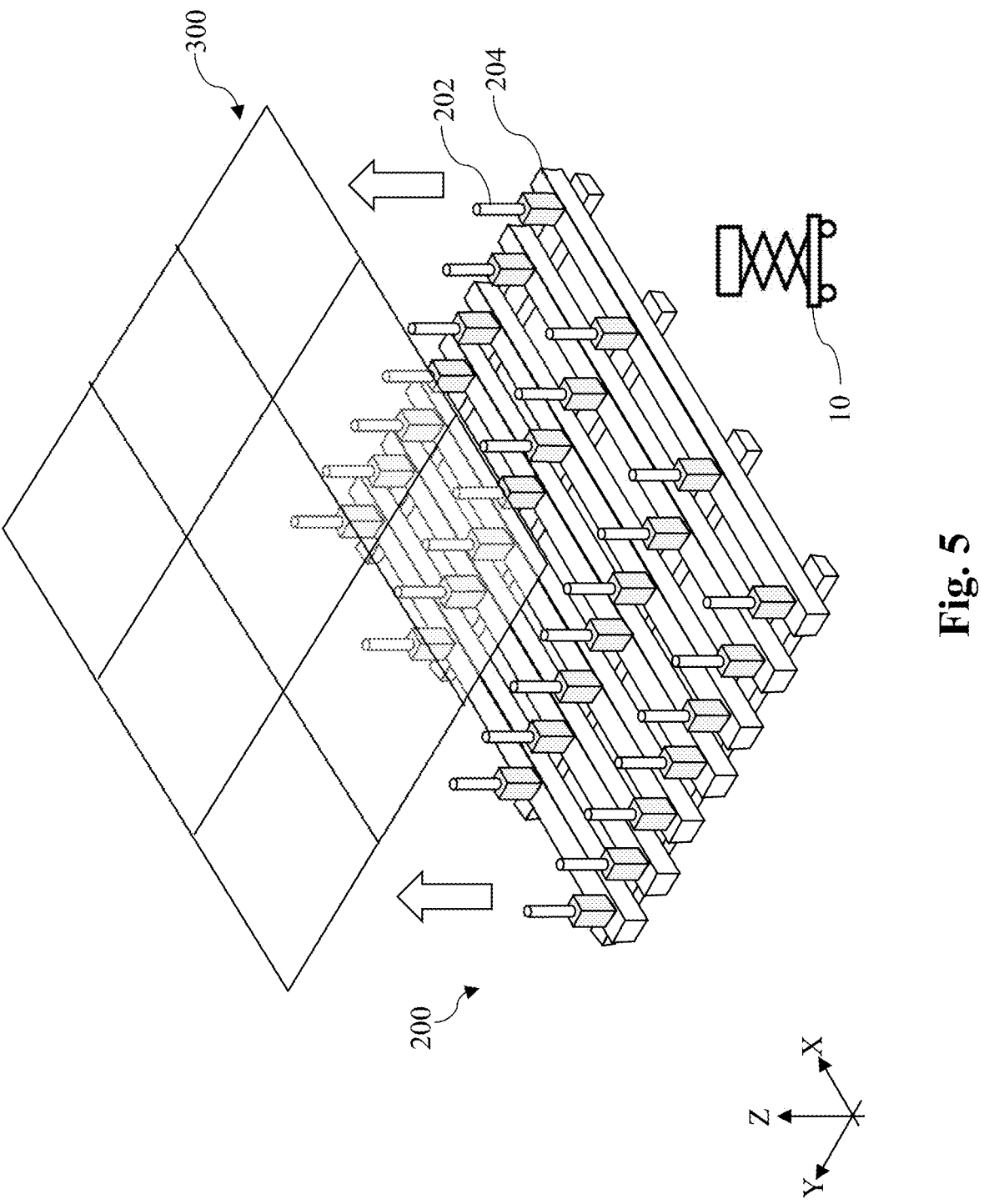
Figure 6:
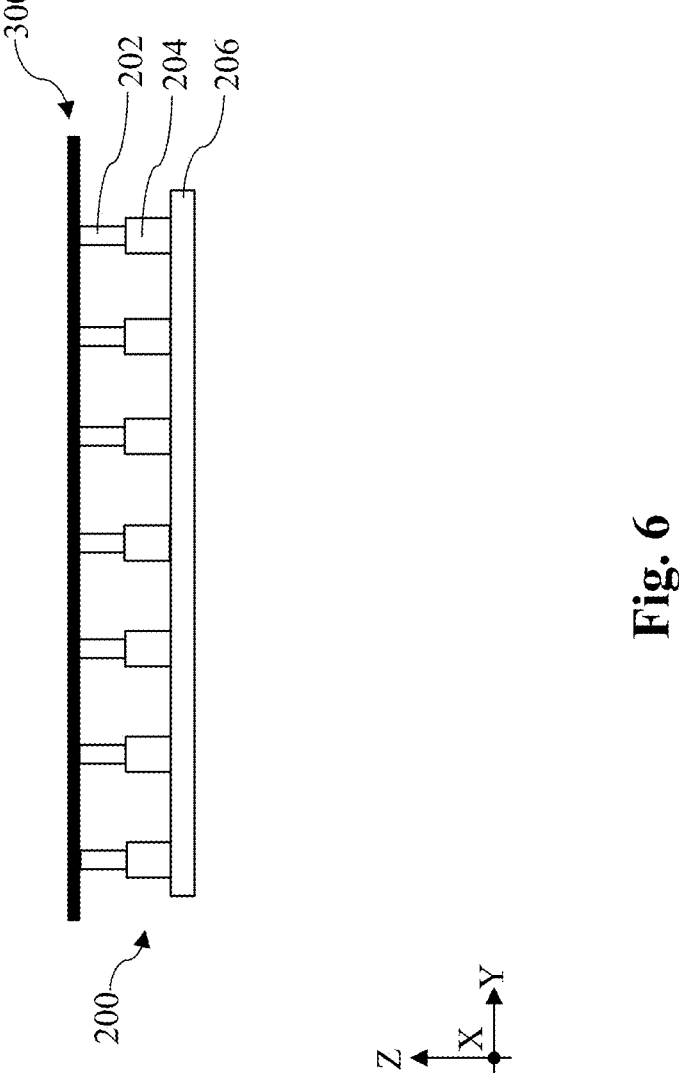

Referring to FIGS. 1, 5 and 6, method 100 includes a block 106 where the modules 200 are installed to a ceiling 300 according to the first rail plan 160. At block 106, the pre-assembled raceway module 200 is raised or elevated adjacent the ceiling 300 for installation. In some instances, the pre-assembled raceway module 200 is elevated using a power scissor lift 10, as shown in FIG. 5, or other lifting tools. It is noted that the power scissor lift 10 is not drawn to scale and its image is included for illustration purpose only. The power scissor lift 10 may be electric-powered and may be self-powered to move around the fab. Fastening of the raceway modules 200 may be achieved using fasteners such as bolts, screws, or nuts. In an example process, a raceway module 200 is elevated by a power scissor lift 10. Once the raceway module 200 is leveled and in position according to the first rail plan 160, the hangers 202 on the raceway module 200 are fastened to the ceiling 300. Compared to the existing component-by-component installation, the hangers 202 are fastened to the first level raceways before they are fastened to the fab ceiling 300. While not explicitly shown in the figures, once a first raceway module 200 is installed to the ceiling 300, a second raceway module 200 is elevated to a position right next to the first raceway module 200 for installation. The first level raceways of two adjacent raceway modules 200 are aligned along the X direction. The installation of raceway modules 200 at block 106 may be repeated several times to fulfill the first rail plan 160. FIG. 6 provides a fragmentary cross-sectional view of a raceway module 200 and the ceiling 300 after the raceway module 200 is installed.

Figure 7:
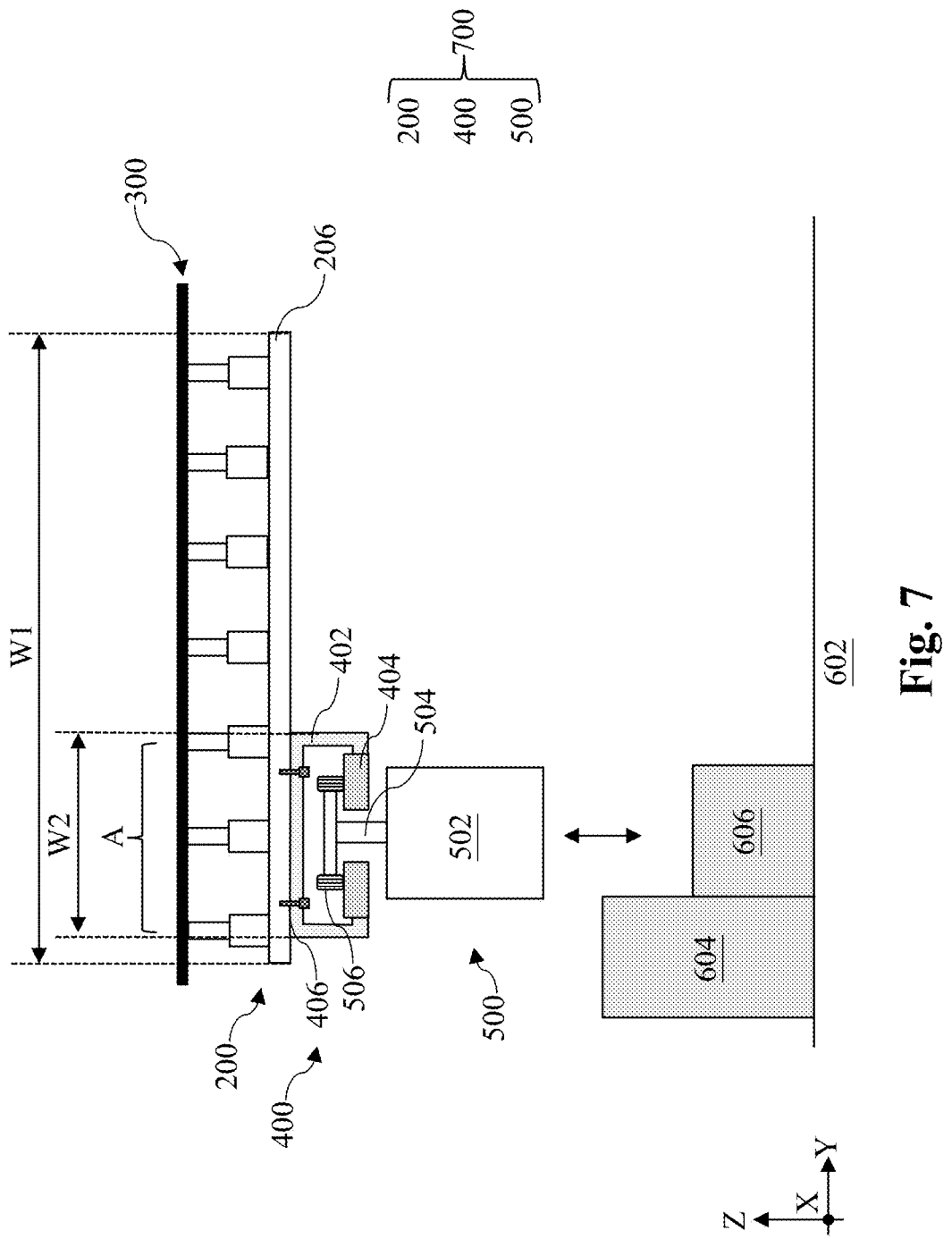
Figure 8:
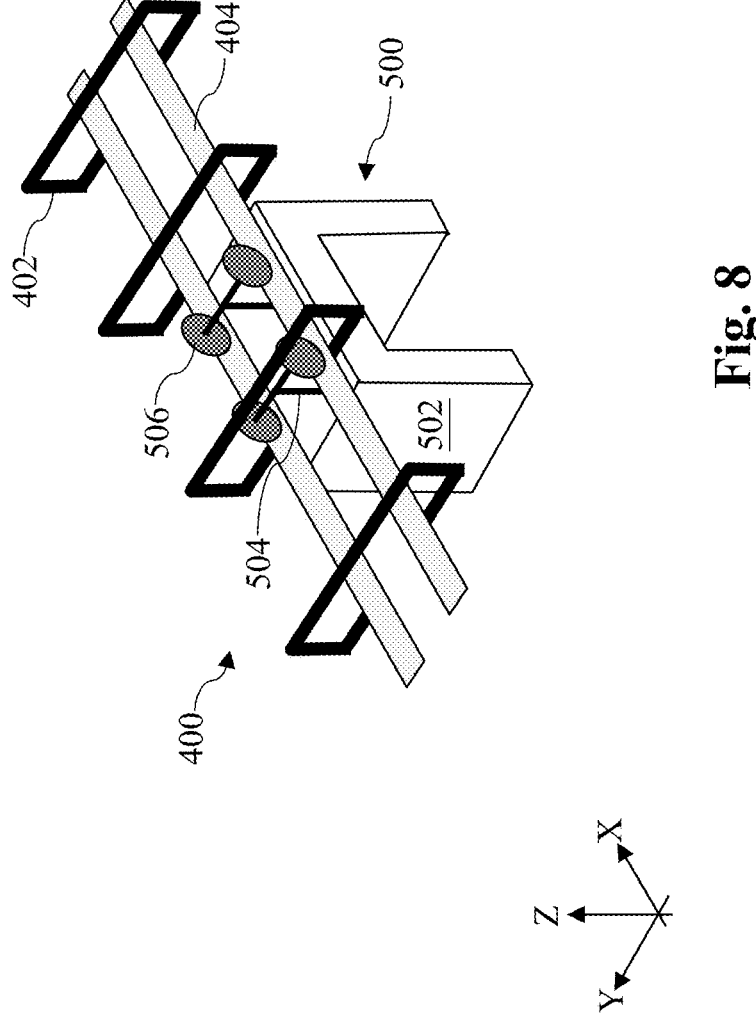

Referring to FIGS. 1 and 7-17, method 100 includes a block 108 where a rail assembly 400 is installed. As shown in FIGS. 7 and 8, the rail assembly 400 includes a plurality of yoke members 402 and two rails 404 that have coplanar surfaces. As shown in FIG. 8, the plurality of yoke members 402 are equally spaced along the X direction and are configured to mechanically support the rails 404 that extend lengthwise along the X direction. In some embodiments, the yoke members 402 and the rails 404 may be formed of aluminum. The rails 404 are mechanically secured to the yoke members 402. In some implementations, the rails 404 are fastened to the yoke members 402 by way of nuts, bolts, or other suitable fasteners. The rails 404 are configured to engage wheels 506 of a vehicle 500 such that the vehicle 500 can travel along the rails 404. As shown in FIGS. 7 and 8, the wheels 506 are configured to rotate while engaging the top surfaces of the rails 404. For installation, the yoke member 402 may be secured to the second level raceway 206 by fasteners 406. The fasteners 406 may be bolts, screws, or other suitable fasteners. The vehicle 500 includes a container 502 that is coupled to wheels 506 through support member 504. In some embodiments, the vehicle 500 may include four (4) wheels 506, two of which ride on one rail 404 and the other two of which ride on the other rail 404.

Reference is now made to FIG. 7. Along the Y direction, the second level raceway 206 is wider than the yoke members 402. As illustrated in FIG. 7, the second level raceway 206 has a first width W1 and each of the yoke members 402 has a second width W2. In some embodiments, the first width W1 is at least three (3) times, such as between 3 times and about 5 times, of the second width W2 such that the second level raceway 206 can accommodate an integer number of installation positions of the yoke members 402. In some instances, the first width W1 is between about 150 cm and about 210 cm, such as 180 cm and the second width W2 is between about 50 cm and about 70 cm. While it is possible for the second level raceway 206 to have a first width W1 greater than five (5) times of the second width W2, such a wide second level raceway 206 may result in a large raceway module 200 that is difficult to install to the ceiling 300.

It should be understood that while the rail assembly 400 shown in the figures includes a dual rail design where two rows of wheels ride on two parallel-extending rails, the rail assembly 400 may include a monorail design. Compared to a dual rail raceway module, a monorail raceway module may be narrower and include a smaller footprint. However, there are advantages in adopting the dual rail design. A dual rail design provides more stability when the fabs are built in geographic locations that are prone to earthquakes. Additionally, the track changing mechanisms for a dual rail design are usually much simpler than those for a monorail design. It is noted that when the rail assembly 400 includes a monorail design, the rail assembly 400 may include more installation positions.

By way of example, FIGS. 7 and 9-16 illustrate five (5) installation positions distributed along the Y direction.

Figure 9:
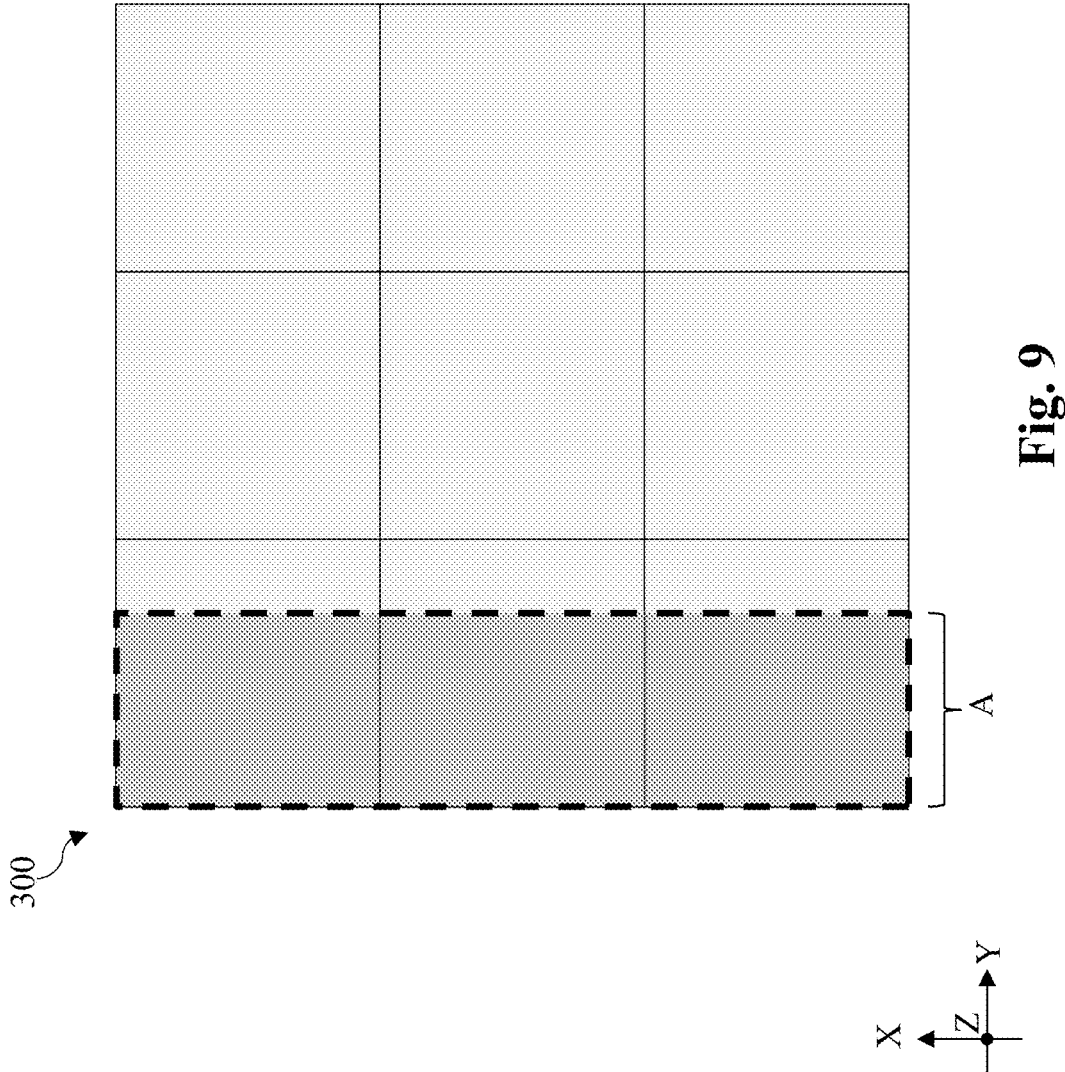
Figure 10:
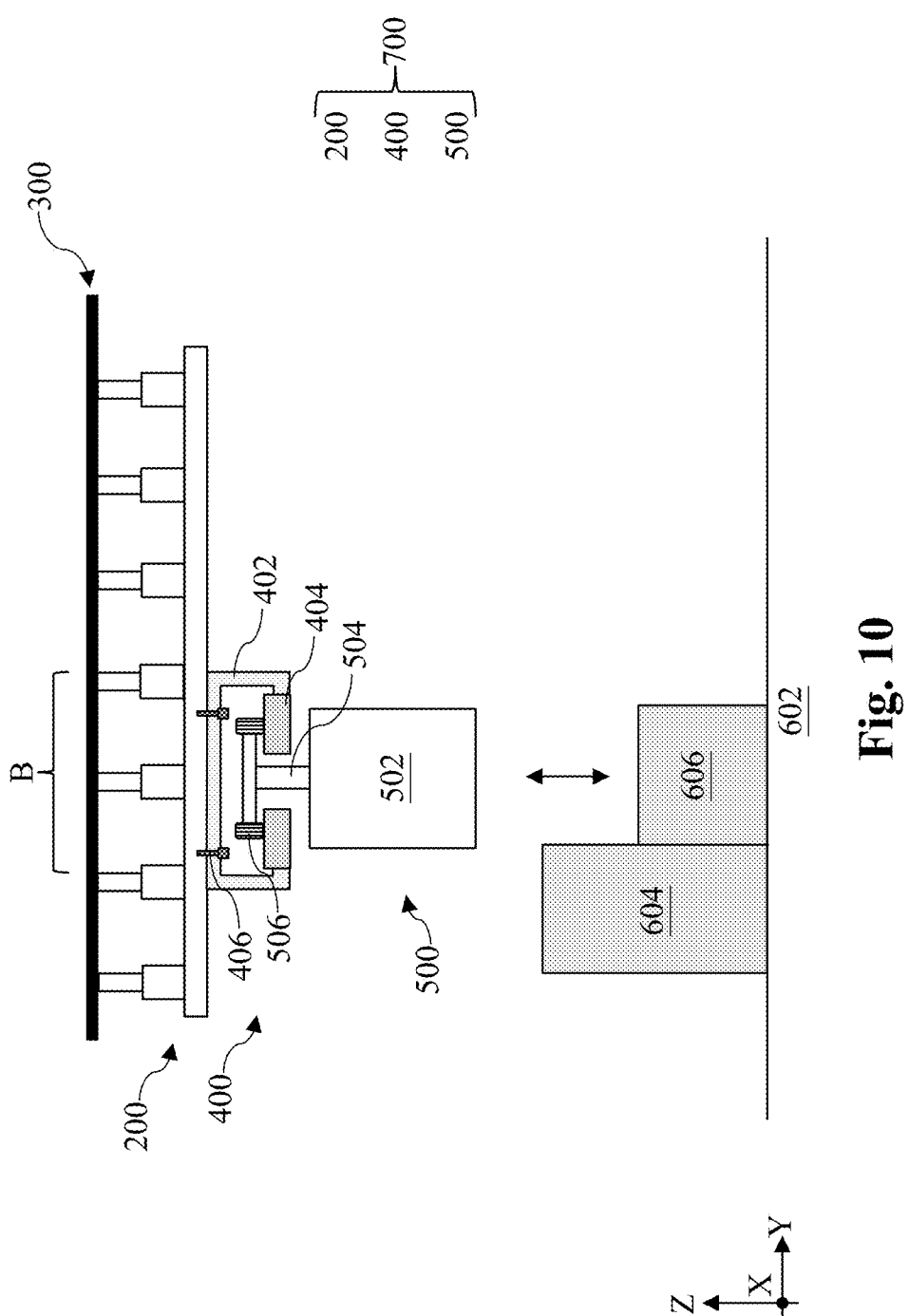
Figure 11:
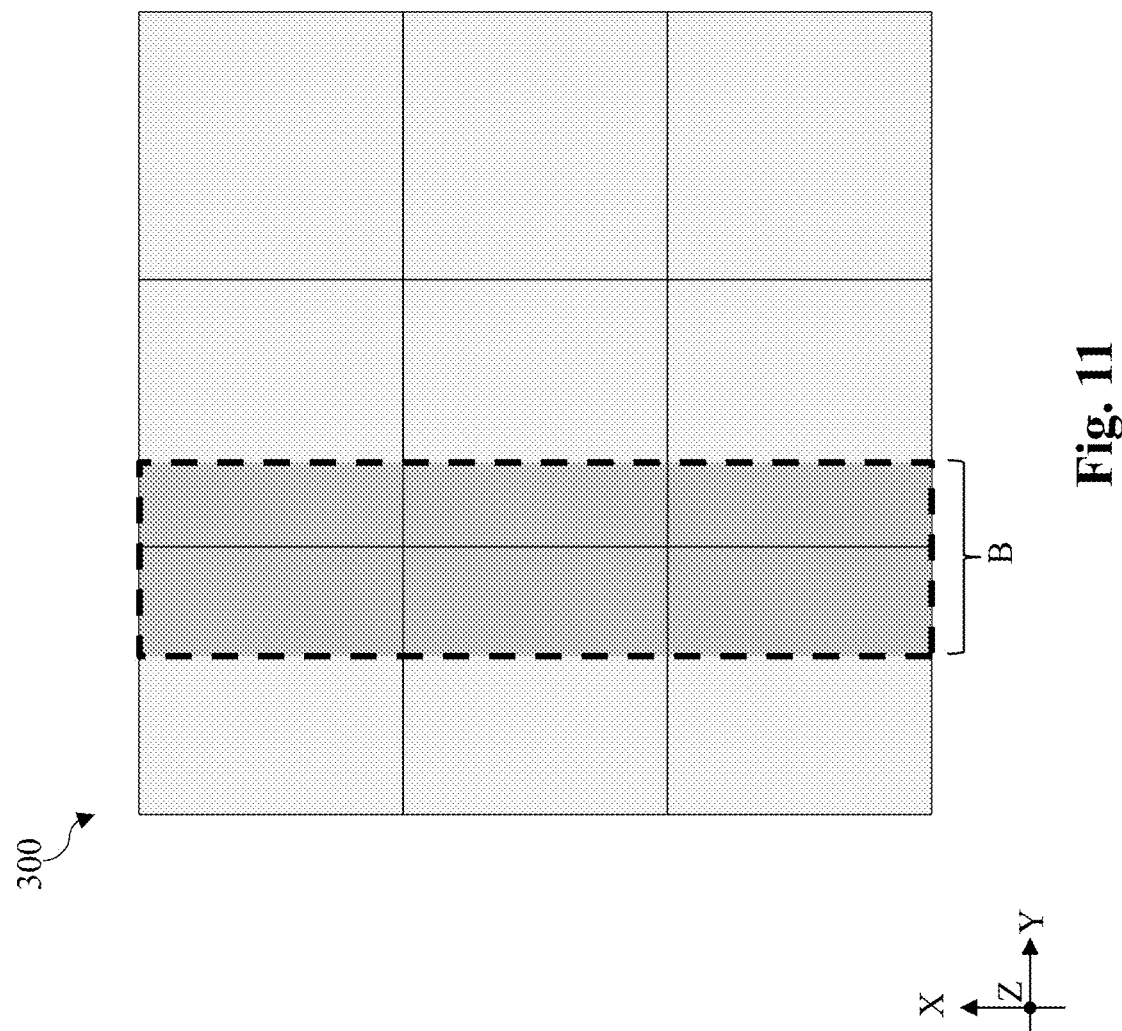
Figure 12:
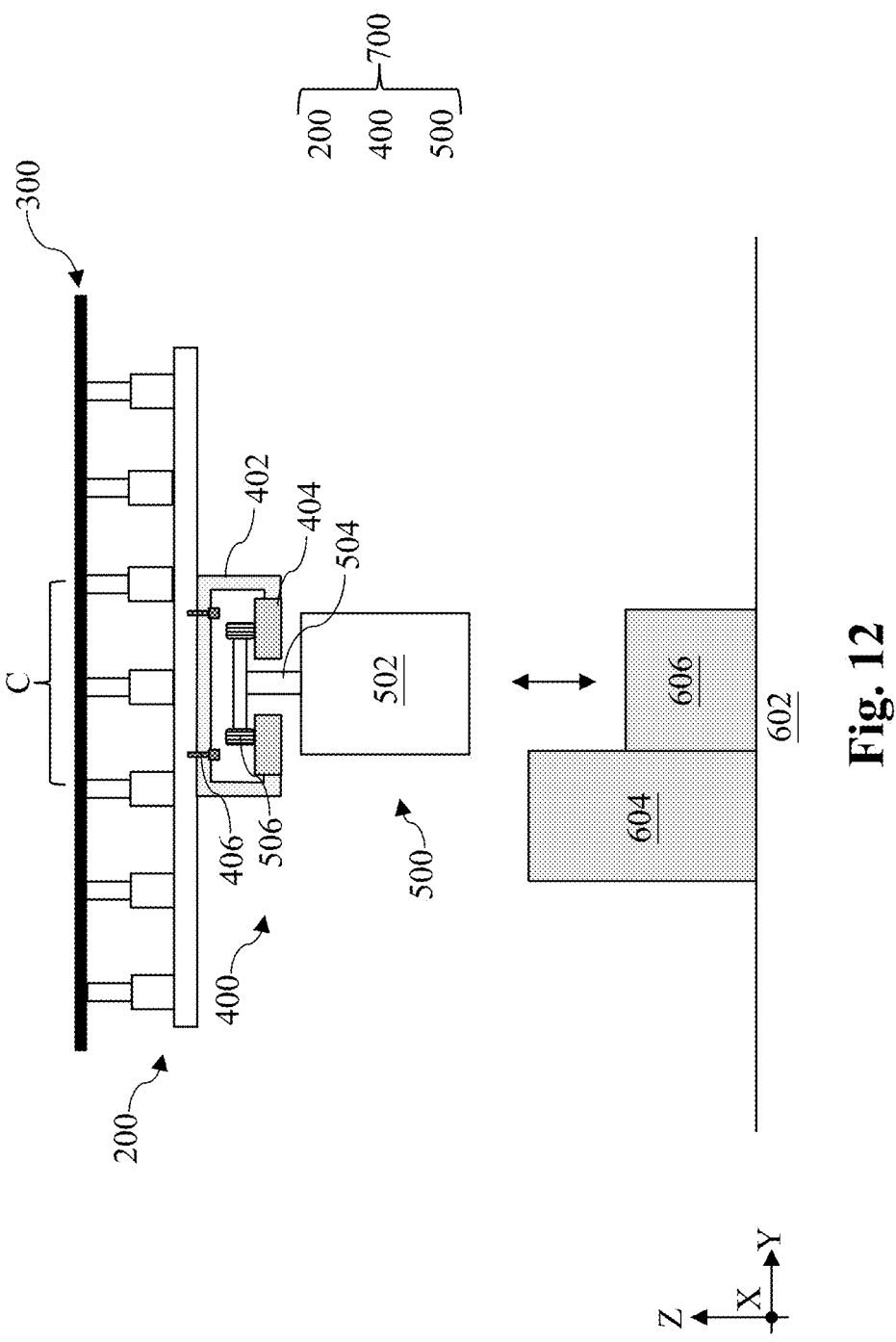
Figure 14:
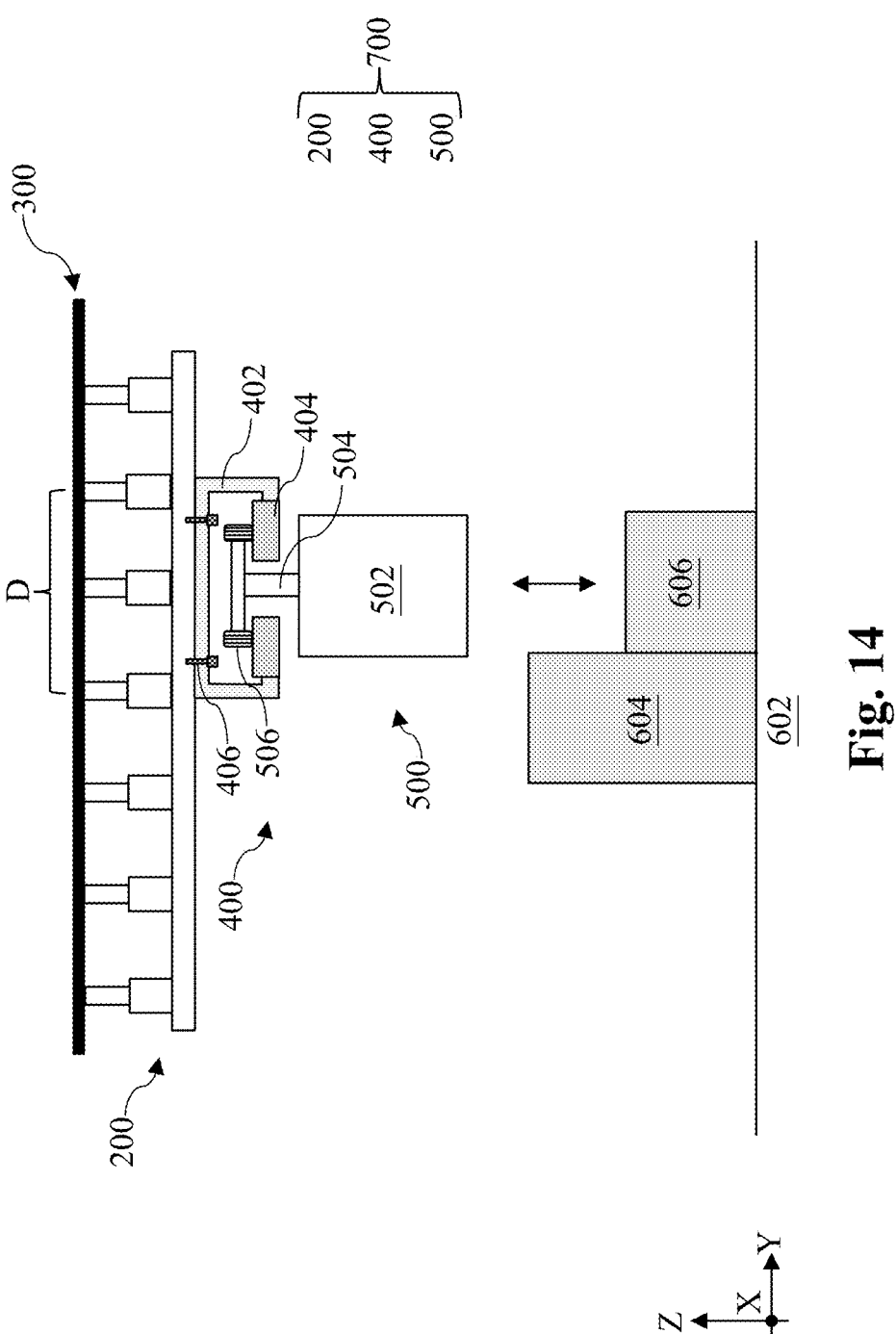
Figure 15:
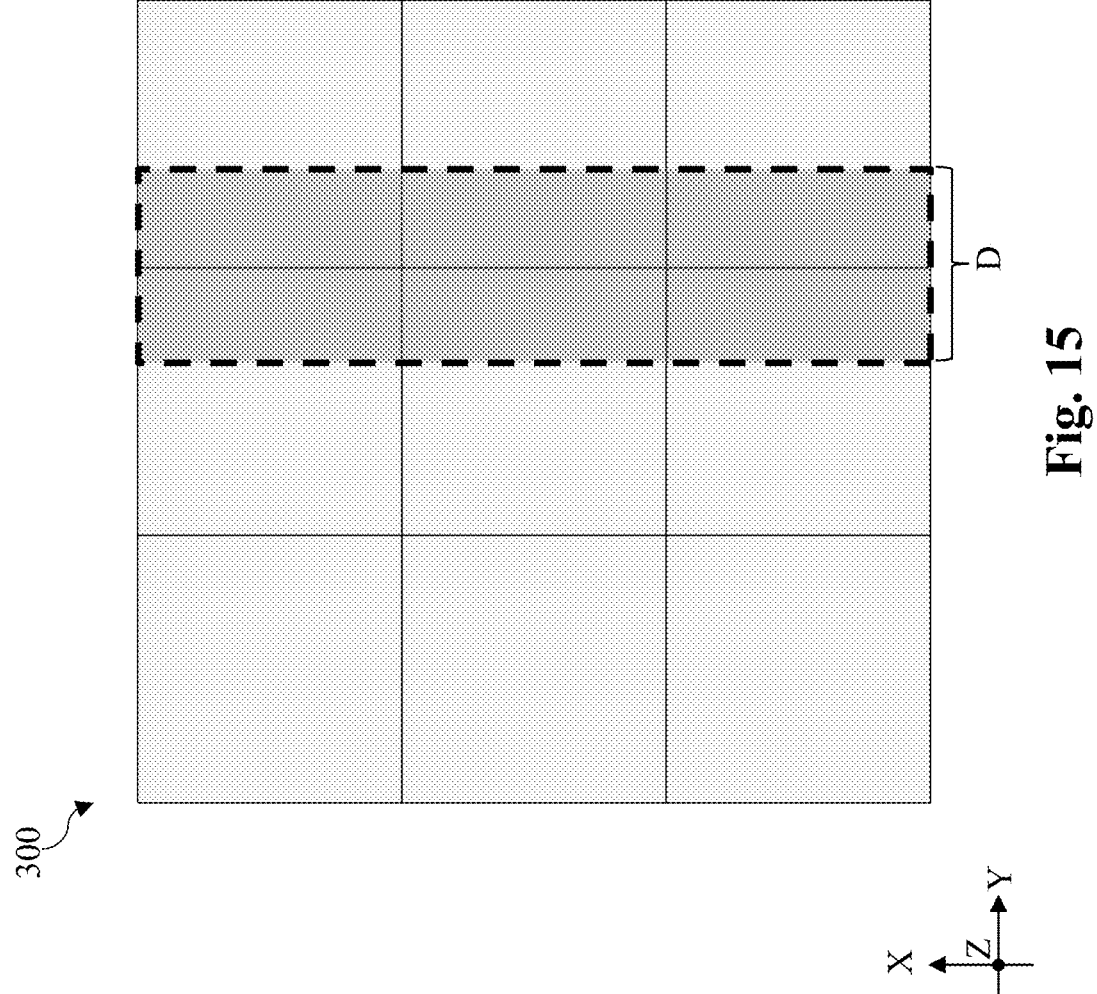
Figure 16:
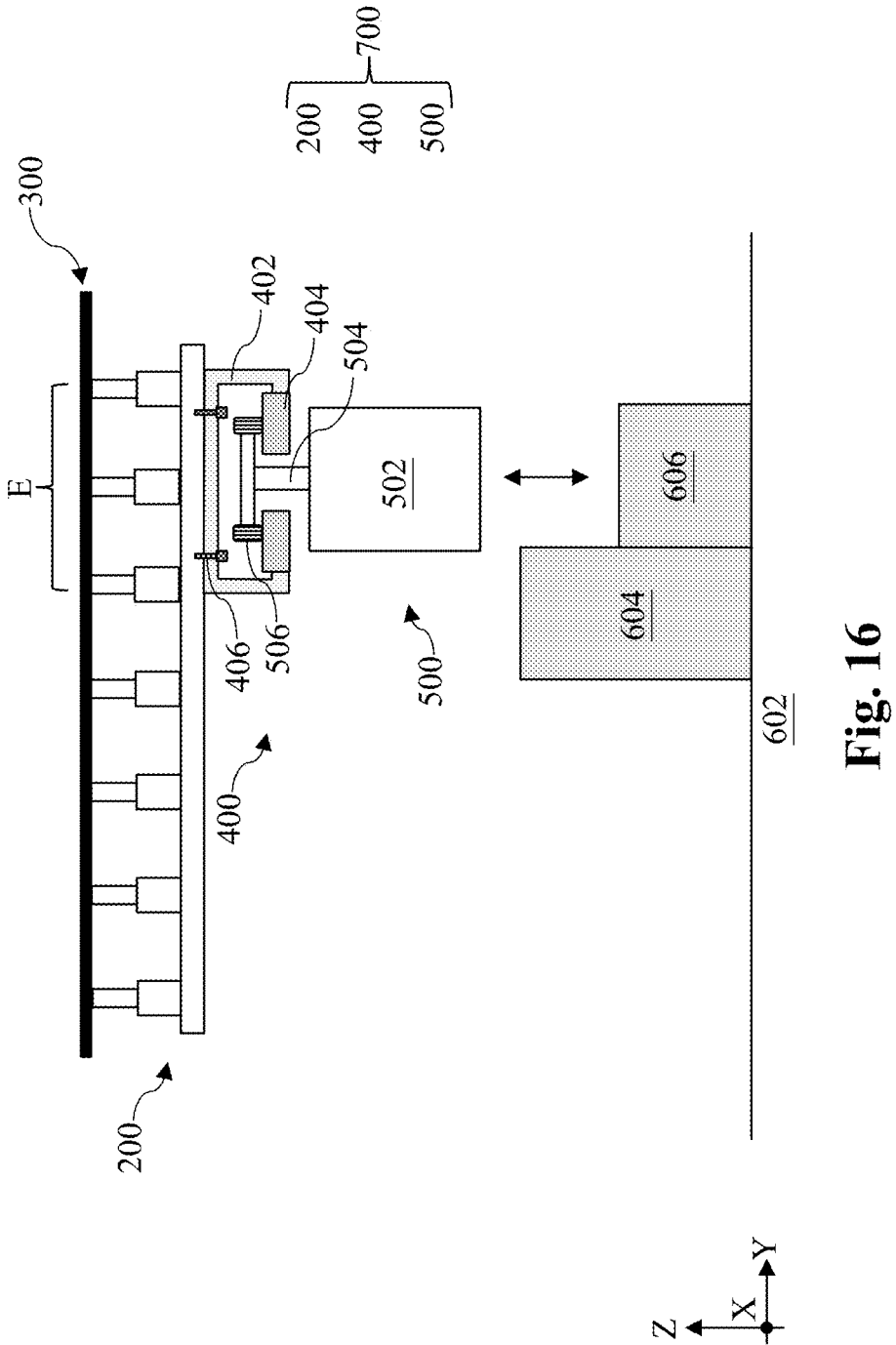

FIGS. 7 and 9 illustrate an installation position A, which allows the vehicle 500 to be directly over a loading port 606 of a process tool 604. The vehicle 500 can lower the container 502 to the load port 606 for loading and unloading of wafers. Referring to FIG. 9, when viewed along the Z direction, a vertical projection area of the yoke members 402 overlaps with a left-most portion of the ceiling 300. FIGS. 10 and 11 illustrate an installation position B, which allows the vehicle 500 to be directly over a loading port 606 of a process tool 604 on a fab floor 602. The vehicle 500 can lower the container 502 to the load port 606 for loading and unloading of wafers. Referring to FIG. 11, when viewed along the Z direction, the vertical projection area of the installation position B partially overlaps with the vertical projection area of the installation position A. FIGS. 12 and 13 illustrate an installation position C, which allows the vehicle 500 to be directly over a loading port 606 of a process tool 604. The vehicle 500 can lower the container 502 to the load port 606 for loading and unloading of wafers. Referring to FIG. 13, when viewed along the Z direction, the vertical projection area of the installation position C partially overlaps with the vertical projection area of the installation position B. FIGS. 14 and 15 illustrate an installation position D, which allows the vehicle 500 to be directly over a loading port 606 of a process tool 604 on a fab floor 602. The vehicle 500 can lower the container 502 to the load port 606 for loading and unloading of wafers. Referring to FIG. 15, when viewed along the Z direction, the vertical projection area of the installation position D partially overlaps with the vertical projection area of the installation position C. FIGS. 16 and 17 illustrate an installation position E, which allows the vehicle 500 to be directly over a loading port 606 of a process tool 604 on a fab floor 602. The vehicle 500 can lower the container 502 to the load port 606 for loading and unloading of wafers. Referring to FIG. 17, when viewed along the Z direction, the vertical projection area of the installation position E partially overlaps with the vertical projection area of the installation position D. As shown in FIGS. 7 and 10-17, because the raceway module 200 is wider than the rail assembly 400 to provide example installation positions A-E, location of the rail assembly 400 may be shifted along the Y direction without uninstallation of the raceway module 200.

Referring to FIG. 1, method 100 includes a block 110 to determine if there is a rail plan change. A rail plan change may be necessitated by several events. For example, a revision of the fab layout design 150, an engineering change to any of the process bays 154 (shown in FIG. 2), installation of an additional process bays 154, or an engineering change to the center aisle 152 (shown in FIG. 2) may all lead to a rail plan change. When the block 110 determines that a rail plan change is not needed ("N"), method 100 proceeds to a block 112. When the block 110 determines that a rail plan change is needed ("Y"), method 100 proceeds to a block 114.

Referring to FIG. 1, when the block 108 determines that there is no change to the first rail plan, method 100 proceeds to block 112 where the first rail plan 160 is released. As used herein, a release of a rail plan is a milestone or a checkmark indicating commencement of ramping up of production. Because the first rail plan 160 is part of the fab layout design 150, the release of the first rail plan 160 usually means release of the fab layout design 150.

Referring to FIG. 1, method 100 proceeds to block 114 when the block 112 determines that there is a change to the first rail plan 160. Once the block 110 determines that a rail plan change is needed, a second rail plan is received at block 114. While not explicitly shown in the figures, the second rail plan embodies changes made to the first rail plan 160. As will be described further below, the second rail plan includes changes that require Y-direction movement of the rail assemblies 400.

Referring to FIGS. 1, 7 and 9-17, method 100 includes a block 116 where a rail position is shifted. As described above, the second rail plan may require Y-direction movement of the rail assemblies 400 along the second level raceways 206. For example, implementation of the second rail plan may require the rail assemblies 400 to shift among the installation positions A-E. In the embodiments illustrated in FIGS. 7 and 9-17, the fasteners 406 securing the rail assemblies 400 to the second level raceway 206 are undone to release them from the current installation positions. Once the rail assembly 400 is moved to the new installation position according to the second rail plan, the rail assembly 400 is secured to the new installation position. It is noted that because the rail assembly 400 only moves between different installation positions on the same second level raceways 206, the rail position shifting at block 116 does not involve removal or reinstallation of the raceway module 200 or any part thereof. Compared to some conventional technology that requires uninstallation of the raceways and hangers to implement rail plan change, operations at block 116 are more time efficient and require a lot less uninstallations.

Referring to FIG. 1, method 100 includes a block 118 where the second rail plan is released. With the rail assemblies 400 reinstalled to new installation positions according to the second rail plan, the rail plan may be ready for release so the production ramping up can commence. It is noted that although the first rail plan 160 and the second rail plan are different in terms of rail assembly locations, they share the same raceway modules 200 installed at the same locations.

Besides illustrating operations of method 100 in FIG. 1, FIGS. 7, 10, 12, 14, and 16 also illustrate a flexible rail system 700 that includes the raceway module 200, the rail assembly 400, and the vehicle 500. Because the yoke member 402 is the widest component in the rail assembly 400, its width (i.e. second width W2) is regarded as the width of the rail assembly 400. As described above, the raceway module 200 has a first width (W1) that is 3 times to about 5 times of the second width (W2) of the rail assembly 400. The wider width of the raceway module 200 to have multiple installation positions for the rail assembly 400 such that the rail assembly 400 can be quickly shifted along a direction perpendicular to the rail length direction when there is a rail plan change. The raceway module 200 is pre-assembled before it is installed to a ceiling 300 of a fab. The vehicle 500 is configured to ride on the rail assembly 400. In other words, the rail assembly 400 is configured to support the vehicle and allow it to travel along the guide rail.

FIGS. 18 and 19 illustrate alternative embodiments where the second level raceway 206 includes a top slide rail 208 and each of the yoke member 402 includes a bottom slide rail 4022 to engage the top slide rail 208. For ease of reference, the raceway module 200 that includes the top slide rail 208 is referred to as a slide raceway module 200'. The bottom slide rail 4022 is configured to be slidable relative to top slide rail 208 along the Y direction.

In the embodiment shown in FIG. 18, the bottom slide rail 4022 of a first slide rail assembly 400' is slidable on the top slide rail 208 along the Y direction, among installation positions A, B, C, D, and E. In some implementations, once the first slide rail assembly 400' slides to the desired installation position, latches 408 may be activated to secure the first slide rail assembly 400' to the top slide rail 208. The latch 408 prevents sliding movement between the top slide rail 208 and the bottom slide rail 4022. It can be seen that the use of slide rails allows rapid change of installation positions and the use of latches 408 makes possible quick positional lock of the first slide rail assembly 400'. In case of a rail plan change determined at block 110 of method 100 in FIG. 1, the latches 408 are unlatched to allow slidability of the first slide rail assembly 400'. The first slide rail assembly 400' then slides from its current location to a new position according to a new rail plan. The latches 408 are then reengaged to lock the first slide rail assembly 400' in its new position on the slide raceway module 200'. The slide raceway module 200', the first slide rail assembly 400' and the vehicle 500 may be referred to as a first slidable rail system 800.

In the embodiment shown in FIG. 19, the bottom slide rail 4022 of a second slide rail assembly 400" is slidable on the top slide rail 208 along the Y direction, among installation positions A, B, C, D, and E. In some implementations, once the second slide rail assembly 400" slides to the desired installation position, locking pins 410 may be inserted through the top slide rail 208 and bottom slide rail 4022 to secure the second slide rail assembly 400" to the top slide rail 208. The locking pins 210 prevents Y-direction sliding movement between the top slide rail 208 and the bottom slide rail 4022. The top slide rail 208 may be integrated with the second level raceways 206 and may therefore be included in the raceway module 200. It can be seen that the use of slide rails allows rapid change of installation positions and the use of locking pins 410 make possible quick positional lock of the second slide rail assembly 400". In case of a rail plan change determined at block 110 of method 100 in FIG. 1, the locking pins 410 are removed to allow slidability of the second slide rail assembly 400". The second slide rail assembly 400" then slides from its current location to a new position according to a new rail plan. The locking pins 410 are then reinserted to lock the second slide rail assembly 400" in its new position on the slide raceway module 200'. The slide raceway module 200', the second slide rail assembly 400" and the vehicle 500 may be referred to as a second slidable rail system 900.

The top slide rail 208 and the bottom slide rail 4022 may come in different complementary shapes to provide vertical and lateral support. The top slide rail 208 provides vertical support in that it carries the weight of the bottom slide rail 4022 and structures connected thereto. The top slide rail provides lateral support in that it restricts lateral movement of the bottom slide rail 4022. These complementary shapes are best shown when viewed along the lengthwise direction of the second level raceway 206, which is parallel to the Y direction. In one embodiment shown in FIG. 20, the top slide rail 208 has an inverse T-shaped and the bottom slide rail 4022 has a C-shape to ride on the top slide rail 208. As shown in FIG. 20, the bottom slide rail 4022 wraps around top slide rail 208. The top slide rail 208 includes top-facing surfaces 2082 to engage bottom-facing surface of the bottom slide rail 4022 and support the weight of the vehicle 500. This way, the bottom slide rail 4022 may be hung on the top slide rail 208 when moving along the top slide rail 208 along the X direction. The top slide rail 208 also includes sidewalls 2084 to limit lateral movement of bottom slide rail 4022. This way, the top slide rail 208 can guide the sliding motion of the bottom slide rail 4022. In another embodiment shown in FIG. 21, each of the top slide rail 208 and the bottom slide rail 4022 has a J-shaped or hook-shaped. As representatively shown in FIG. 21, the J-shape of the bottom slide rail 4022 is arranged upside down such that the bottom slide rail 4022 can be hung on the top slide rail 208. Like the top slide rail 208 in FIG. 20, the top slide rail 208 includes top-facing surface 2082 to engage bottom-facing surface of the bottom slide rail 4022 and support the weight of the vehicle 500 and sidewalls 2084 to guide the sliding motion of the bottom slide rail 4022. In embodiments represented in FIGS. 20 and 21, the ability to hang the bottom slide rail 4022 on the top slide rail 208 significantly simplifies the rail change process because the installation personnel do not need to support the rail assemblies 400 when moving them among different installation positions.

Although not intended to be limiting, one or more embodiments of the present disclosure provide modularized raceway modules that are pre-assembled and installed on a module-by-module basis. The raceway module is wider than the rail assembly and includes multiple installation positions for the rail assembly. The rail assemblies may be fastened to different installation positions or may be slidable among different installation positions. The features of the present disclosure allow rapid implementation of rail plan changes without the need to uninstall and reinstall of the raceway modules. Aspects of the present disclosure improve layout flexibility, reduce fab ramping up time, and minimize production line impact brought about by rail plan changes.

The present disclosure provides for many different embodiments. In one exemplary aspect, the present disclosure is directed to an overhead transport (OHT) system. The OHT system includes a raceway module configured to be installed to a ceiling, a rail assembly that includes at least one rail extending along a first direction. The raceway module includes a first width (W1) and the rail assembly includes a second width (W2). The first width (W1) is greater than the second width (W2). The raceway module includes a plurality of installation positions along a second direction perpendicular to the second direction. The rail assembly is configured to be fasten to any of the plurality of installation positions.

In some embodiments, a ratio of the first width (W1) to the second width (W2) is between 3 and 5. In some implementations, the raceway module includes a plurality of first level raceways extending along the first direction and a plurality of second level raceways extending along the second direction and disposed below the plurality of first level raceways. The rail assembly further includes a plurality of yoke members and the plurality of yoke members are mechanically fastened to the plurality of second level raceways in one of the plurality of installation positions. In some instances, each of the plurality of second level raceways includes a top slide rail, each of the plurality of the yoke members includes a bottom slide rail, and the bottom slide rail is slidably engaged to the top slide rail such that each of the plurality of yoke members is slidable among the plurality of installation positions. In some embodiments, the top slide rail includes an inverse-T shape when viewed along the second direction and the bottom slide rail includes a C shape when viewed along the second direction to wrap around the top slide rail. In some embodiments, the top slide rail includes a J shape when viewed along the second direction and the bottom slide rail includes a hook shape when viewed along the second direction such that the top slide rail supports the bottom slide rail vertically and laterally.

In another exemplary aspect, the present disclosure is directed to a method. The method includes assembling an overhead raceway module that includes a plurality of first level raceways extending along a first direction, each of the plurality of first level raceways being fastened to a plurality of hangers, a plurality of second level raceways extending along a second direction perpendicular to the first direction, each of the plurality of second level raceways being fastened to the plurality of first level raceways and including an upper support rail, installing the overhead raceway module to a ceiling by fastening the plurality of hangers to the ceiling, and slidably attaching a rail assembly to the plurality of second level raceways. The rail assembly includes a lower support rail configured to engage the upper support rail.

In some embodiments, the rail assembly extends lengthwise along the first direction and has a width along the second direction and a width of the overhead raceway module along the second direction is at least three times the width of the rail assembly. In some implementations, the method may further include after the slidably attaching, activating a latch mechanism to lock the rail assembly in position. In some instances, the overhead raceway module includes a length along the first direction and a width along the second direction. The length is between about 150 cm and about 210 cm and the width is between about 150 cm and about 210 cm. In some implementations, the plurality of first level raceways vertically intersect the plurality of second level raceways at a plurality of intersection points and the plurality of hangers are disposed directly over the plurality of intersection points.

In yet another exemplary aspect, the present disclosure is directed to a method. The method includes receiving a first rail plan, assembling an overhead raceway module including a plurality of installation positions for a rail assembly, installing the overhead raceway module to a ceiling, installing the rail assembly to one of the plurality of installation positions according to the first rail plan, receiving a second rail plan different from the first rail plan, and reinstalling the rail assembly to another of the plurality of the installation positions according to the second rail plan without uninstalling the overhead raceway module from the ceiling.

In some embodiments, the installing the rail assembly to another of the plurality of the installation positions according to the second rail plan does not include uninstalling the overhead raceway module from the ceiling. In some implementations, the assembling includes receiving a plurality of hangers, a plurality of first level raceways extending lengthwise along a first direction; and a plurality of second level raceways extending lengthwise along a second direction perpendicular to the first direction, and fastening the plurality of first level raceways to the plurality of second level raceways. In some instances, a width of the overhead raceway module along the second direction is at least three times a width of the rail assembly along the second direction. In some embodiments, the plurality of installation positions are distributed along the second direction. In some embodiments, each of the plurality of second level raceways includes an upper slide rail, the rail assembly includes a lower slide rail, and the installing of the rail assembly includes slidably engaging the lower slide rail to the upper slide rail. In some instances, the reinstalling includes sliding the lower slide rail along the upper slide rail. In some implementations, the installing of the rail assembly includes activating a latch mechanism that prevents the lower slide rail from being slidable along the upper slide rail. In some instances, when the lower slide rail engages the upper slide rail, a top facing surface of the upper slide rail engages a bottom-facing surface of the lower slide rail.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
assembling an overhead raceway module comprising:
   a plurality of first level raceways extending along a first direction, each of the plurality of first level raceways being fastened to a plurality of hangers,
   a plurality of second level raceways extending along a second direction perpendicular to the first direction, each of the plurality of second level raceways being fastened to the plurality of first level raceways and comprising an upper support rail;
after the assembling of the overhead raceway module, installing the overhead raceway module to a ceiling by fastening the plurality of hangers to the ceiling; and
slidably attaching a rail assembly to the plurality of second level raceways,
wherein the rail assembly comprises a lower support rail configured to engage the upper support rail.

2. The method of claim 1,
wherein the rail assembly extends lengthwise along the first direction and has a width along the second direction,
wherein a width of the overhead raceway module along the second direction is at least three times the width of the rail assembly.

3. The method of claim 1, further comprising:
after the slidably attaching, activating a latch mechanism to lock the rail assembly in position.

4. The method of claim 1,
wherein the overhead raceway module comprises a length along the first direction and a width along the second direction,
wherein the length is between about 150 cm and about 210 cm,
wherein the width is between about 150 cm and about 210 cm.

5. The method of claim 1,
wherein the plurality of first level raceways vertically intersect the plurality of second level raceways at a plurality of intersection points,
wherein the plurality of hangers are disposed directly over the plurality of intersection points.

6. A method, comprising:
receiving a first rail plan;
assembling an overhead raceway module comprising a plurality of installation positions for a rail assembly;
after the assembling of the overhead raceway module, installing the overhead raceway module to a ceiling;
installing the rail assembly to one of the plurality of installation positions according to the first rail plan;
after the installing of the rail assembly, receiving a second rail plan different from the first rail plan; and
reinstalling the rail assembly to another of the plurality of the installation positions according to the second rail plan without uninstalling the overhead raceway module from the ceiling.

7. The method of claim 6, wherein the installing the rail assembly to another of the plurality of the installation positions according to the second rail plan do not include uninstalling the overhead raceway module from the ceiling.

8. The method of claim 6, wherein the assembling comprises:
receiving a plurality of hangers, a plurality of first level raceways extending lengthwise along a first direction; and a plurality of second level raceways extending lengthwise along a second direction perpendicular to the first direction; and
fastening the plurality of first level raceways to the plurality of second level raceways.

9. The method of claim 8, wherein a width of the overhead raceway module along the second direction is at least three times a width of the rail assembly along the second direction.

10. The method of claim 8, wherein the plurality of installation positions are distributed along the second direction.

11. The method of claim 8,
wherein each of the plurality of second level raceways comprises an upper slide rail,
wherein the rail assembly comprises a lower slide rail,
wherein the installing of the rail assembly comprises slidably engaging the lower slide rail to the upper slide rail.

12. The method of claim 11, wherein the reinstalling comprises sliding the lower slide rail along the upper slide rail.

13. The method of claim 11, wherein the installing of the rail assembly comprises activating a latch mechanism that prevents the lower slide rail from being slidable along the upper slide rail.

14. The method of claim 11, wherein when the lower slide rail engages the upper slide rail, a top facing surface of the upper slide rail engages a bottom-facing surface of the lower slide rail.

15. A method, comprising:
installing a pre-assembled overhead raceway module to a ceiling, the pre-assembled overhead raceway module comprising:
   a plurality of first level raceways extending along a first direction, each of the plurality of first level raceways being fastened to a plurality of hangers configured to be mounted on the ceiling, and
   a plurality of second level raceways extending along a second direction perpendicular to the first direction, each of the plurality of second level raceways being fastened to the plurality of first level raceways;
installing a rail assembly to a first position on the plurality of second level raceways; and
shifting the rail assembly from the first position to a second position on the plurality of second level raceways,
wherein the second position is spaced apart from the first position along the second direction.

16. The method of claim 15,
wherein each of the plurality of second level raceways comprises a first width along the second direction,
wherein the rail assembly comprises a second width along the second direction,
wherein the first width is greater than the second width.

17. The method of claim 16, wherein a ratio of the first width to the second width is between 3 and 5.

18. The method of claim 15, wherein the installing of the rail assembly comprises slidably attaching the rail assembly to the plurality of second level raceways.

19. The method of claim 18, wherein the installing of the rail assembly further comprises after the slidably attaching, activating a latch mechanism to lock the rail assembly.

20. The method of claim 15, wherein the rail assembly is configured to engage wheels of an overhead transport vehicle such that the overhead transport vehicle is movable along the rail assembly along the first direction.

5

* * * * *